(12) United States Patent
Olcay et al.

(10) Patent No.: US 8,739,004 B2
(45) Date of Patent: May 27, 2014

(54) SYMBOL FLIPPING LDPC DECODING SYSTEM

(75) Inventors: Sancar K. Olcay, Sunnyvale, CA (US); Lei Chen, Santa Clara, CA (US); Madhusudan Kalluri, Sunnyvale, CA (US); Johnson Yen, Fremont, CA (US); Ngok Ying Chu, Los Altos, CA (US)

(73) Assignee: LSI Corporation, Milpitas, CA (US)

( * ) Notice: Subject to any disclaimer, the term of this patent is extended or adjusted under 35 U.S.C. 154(b) by 190 days.

(21) Appl. No.: 13/468,968

(22) Filed: May 10, 2012

(65) Prior Publication Data

US 2013/0305114 A1 Nov. 14, 2013

(51) Int. Cl.
*H03M 13/00* (2006.01)

(52) U.S. Cl.
USPC ........... 714/780; 714/758; 714/752; 714/762; 714/773; 714/759; 714/785; 714/786; 714/792; 714/804

(58) Field of Classification Search
None
See application file for complete search history.

(56) References Cited

U.S. PATENT DOCUMENTS

| | | | | |
|---|---|---|---|---|
| 7,395,495 B2* | 7/2008 | Jacobsen | | 714/804 |
| 8,196,016 B1* | 6/2012 | Langner et al. | | 714/758 |
| 8,352,827 B2* | 1/2013 | Gong et al. | | 714/752 |
| 8,495,462 B1* | 7/2013 | Liu | | 714/759 |
| 2008/0301517 A1* | 12/2008 | Zhong | | 714/752 |
| 2010/0042890 A1* | 2/2010 | Gunnam | | 714/752 |
| 2010/0042897 A1* | 2/2010 | Han et al. | | 714/752 |
| 2011/0138253 A1* | 6/2011 | Gunnam | | 714/773 |
| 2012/0005551 A1 | 1/2012 | Gunnam et al. | | |
| 2012/0185744 A1* | 7/2012 | Varnica et al. | | 714/752 |

OTHER PUBLICATIONS

Kang et al., "A Two-Stage Iterative Decoding of LDPC Codes for Lowering Error Floors", IEEE GLOBECOM Proceedings, 1088-1091 (2008).*
Lin et al "An efficient VLSI Architecture for non binary LDPC decoders"—IEEE Transaction on Circuits and Systems II vol. 57, Issue 1 (Jan. 2010) pp. 51-55.
Perisa et al "Frequency Offset Estimation Based on Phase Offsets Between Sample Correlations" Dept. of Info. Tech. University of Ulm 2005.
U.S. Appl. No. 13/452,733, filed Apr. 20, 2012, Shaohua Yang, Unpublished.
U.S. Appl. No. 13/450,289, filed Apr. 18, 2012, Shaohua Yang, Unpublished.
U.S. Appl. No. 13/284,754, filed Oct. 28, 2011, Fan Zhang, Unpublished.
U.S. Appl. No. 13/363,751, filed Feb. 1, 2012, Lei Chen, Unpublished.

* cited by examiner

*Primary Examiner* — John Trimmings
(74) *Attorney, Agent, or Firm* — Hamilton DeSanctis & Cha

(57) ABSTRACT

Various embodiments of the present inventions provide a symbol flipping LDPC decoding system. For example, a symbol flipping data processing system is disclosed that includes a low density parity check decoder operable to decode codewords and to identify unsatisfied parity checks, a symbol flipping controller operable to change values of at least one symbol in the codewords based on the unsatisfied parity checks to assist the low density parity check decoder to decode the codewords, a scheduler operable to control a decoding and symbol flipping mode in the low density parity check decoder and the symbol flipping controller, and a hard decision queue operable to store hard decisions for converged codewords from the low density parity check decoder.

20 Claims, 6 Drawing Sheets

SYMBOL FLIPPING LDPC DECODING SYSTEM

BACKGROUND

Various data transfer systems have been developed including storage systems, cellular telephone systems, and radio transmission systems. In each of the systems data is transferred from a sender to a receiver via some medium. For example, in a storage system, data is sent from a sender (i.e., a write function) to a receiver (i.e., a read function) via a storage medium. As information is stored and transmitted in the form of digital data, errors are introduced that, if not corrected, can corrupt the data and render the information unusable. The effectiveness of any transfer is impacted by any losses in data caused by various factors. Many types of error checking systems have been developed to detect and correct errors in digital data. For example, in perhaps the simplest system, a parity bit can be added to a group of data bits, ensuring that the group of data bits (including the parity bit) has either an even or odd number of ones. When using odd parity, as the data is prepared for storage or transmission, the number of data bits in the group that are set to one are counted, and if there is an even number of ones in the group, the parity bit is set to one to ensure that the group has an odd number of ones. If there is an odd number of ones in the group, the parity bit is set to zero to ensure that the group has an odd number of ones. After the data is retrieved from storage or received from transmission, the parity can again be checked, and if the group has an even parity, at least one error has been introduced in the data. At this simplistic level, some errors can be detected but not corrected.

The parity bit may also be used in error correction systems, including in LDPC decoders. An LDPC code is a parity-based code that can be visually represented in a Tanner graph 100 as illustrated in FIG. 1. In an LDPC decoder, multiple parity checks are performed in a number of check nodes 102, 104, 106 and 108 for a group of variable nodes 110, 112, 114, 116, 118, 120, 122, and 124. The connections (or edges) between variable nodes 110-124 and check nodes 102-108 are selected as the LDPC code is designed, balancing the strength of the code against the complexity of the decoder required to execute the LDPC code as data is obtained. The number and placement of parity bits in the group are selected as the LDPC code is designed. Messages are passed between connected variable nodes 110-124 and check nodes 102-108 in an iterative process, passing beliefs about the values that should appear in variable nodes 110-124 to connected check nodes 102-108. Parity checks are performed in the check nodes 102-108 based on the messages and the results are returned to connected variable nodes 110-124 to update the beliefs if necessary. LDPC decoders may be implemented in binary or non-binary fashion. In a binary LDPC decoder, variable nodes 110-124 contain scalar values based on a group of data and parity bits that are retrieved from a storage device, received by a transmission system or obtained in some other way. Messages in the binary LDPC decoders are scalar values transmitted as plain-likelihood probability values or log-likelihood-ratio (LLR) values representing the probability that the sending variable node contains a particular value. In a non-binary LDPC decoder, variable nodes 110-124 contain symbols from a Galois Field, a finite field $GF(p^k)$ that contains a finite number of elements, characterized by size $p^k$ where p is a prime number and k is a positive integer. Messages in the non-binary LDPC decoders are multi-dimensional vectors, generally either plain-likelihood probability vectors or LLR vectors.

The connections between variable nodes 110-124 and check nodes 102-108 may be presented in matrix form as follows, where columns represent variable nodes, rows represent check nodes, and a random non-zero element a(i,j) from the Galois Field at the intersection of a variable node column and a check node row indicates a connection between that variable node and check node and provides a permutation for messages between that variable node and check node:

$$H = \begin{bmatrix} a(1,1) & 0 & 0 & a(1,2) & 0 & a(1,3) & a(1,4) & 0 \\ 0 & a(2,1) & 0 & 0 & a(2,2) & 0 & 0 & a(2,3) \\ a(3,1) & 0 & a(3,2) & 0 & a(3,3) & a(3,4) & 0 & a(3,5) \\ 0 & a(4,1) & 0 & a(4,2) & 0 & 0 & a(4,3) & a(4,4) \end{bmatrix}$$

By providing multiple check nodes 102-108 for the group of variable nodes 110-124, redundancy in error checking is provided, enabling errors to be corrected as well as detected. Each check node 102-108 performs a parity check on bits or symbols passed as messages from its neighboring (or connected) variable nodes. In the example LDPC code corresponding to the Tanner graph 100 of FIG. 1, check node 102 checks the parity of variable nodes 110, 116, 120 and 122. Values are passed back and forth between connected variable nodes 110-124 and check nodes 102-108 in an iterative process until the LDPC code converges on a value for the group of data and parity bits in the variable nodes 110-124. For example, variable node 110 passes messages to check nodes 102 and 106. Check node 102 passes messages back to variable nodes 110, 116, 120 and 122. The messages between variable nodes 110-124 and check nodes 102-108 are probabilities or beliefs, thus the LDPC decoding algorithm is also referred to as a belief propagation algorithm. Each message from a node represents the probability that a bit or symbol has a certain value based on the current value of the node and on previous messages to the node.

A message from a variable node to any particular neighboring check node is computed using any of a number of algorithms based on the current value of the variable node and the last messages to the variable node from neighboring check nodes, except that the last message from that particular check node is omitted from the calculation to prevent positive feedback. Similarly, a message from a check node to any particular neighboring variable node is computed based on the current value of the check node and the last messages to the check node from neighboring variable nodes, except that the last message from that particular variable node is omitted from the calculation to prevent positive feedback. As iterations are performed in the system, messages pass back and forth between variable nodes 110-124 and check nodes 102-108, with the values in the nodes 102-124 being adjusted based on the messages that are passed, until the values converge and stop changing or until processing is halted.

Although LDPC decoders in general approach the Shannon limit, the theoretical capacity of a communications channel to transfer information for a particular noise level, a need remains for improvements in LDPC decoders, particularly when they fail to converge or fail to properly decode data.

BRIEF SUMMARY

Various embodiments of the present invention are related to symbol flipping data decoding systems. For example, a symbol flipping data processing system is disclosed that includes an LDPC decoder operable to decode codewords and to identify unsatisfied parity checks, a symbol flipping controller operable to change values of at least one symbol in the codewords based on the unsatisfied parity checks to assist the low density parity check decoder to decode the codewords, a scheduler operable to control a decoding and symbol flipping mode in the low density parity check decoder and the symbol flipping controller, and a hard decision queue operable to store hard decisions for converged codewords from the low density parity check decoder.

In some embodiments, the symbol flipping controller implements a first symbol flipping mode in which one symbol at a time in an unsatisfied check pool is flipped through each possible value in a Galois Field while decoding iterations are performed, a second symbol flipping mode in which two symbols at a time from the unsatisfied check pool are flipped through each possible combination of values in the Galois Field while decoding iterations are performed, and a third symbol flipping mode in which two symbols at a time from the unsatisfied check pool are flipped through each possible combination of values in the Galois Field while decoding iterations are performed to yield at least one new unsatisfied check pool to be used in symbol flipping operation.

In some embodiments, an external error checker such as a cyclic redundancy check (CRC) circuit is used to determine which of a number of possible output sectors is correct, where the possible output sectors are generated based on hard decisions for converged component codewords generated during symbol flipping operations.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification.

DETAILED DESCRIPTION OF THE INVENTION

Figure 1:
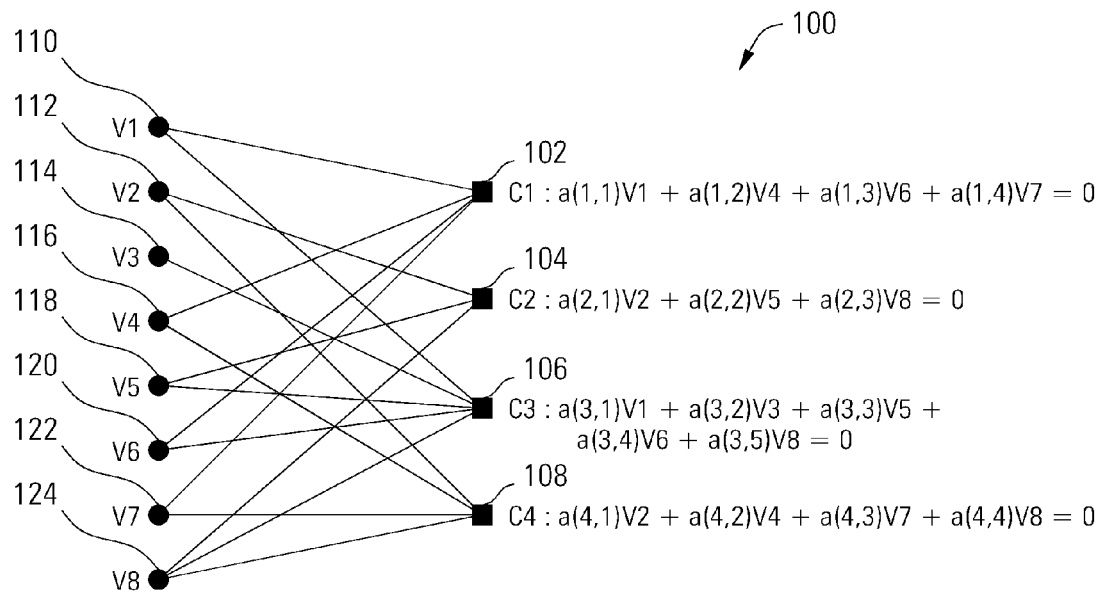
FIG. 1 depicts a Tanner graph of an example prior art LDPC code.

Various embodiments of the present inventions are related to symbol flipping low density parity check (LDPC) data decoding systems. An LDPC decoder in the system decodes component codewords and yields a decoded output when parity checks are satisfied for the decoded component codewords. Symbol flipping is initiated when normal decoding fails, for example when the original data cannot be recovered from hard decisions produced by the normal decoding, or when the LDPC decoder converges on incorrect values. Decoding failure can be caused by an imperfect codeword that generates no failed parity checks even when the original data has not been properly recovered, or because of trapping sets, sets of variables nodes that are not well connected in the Tanner graph. During targeted symbol flipping, the input hard decision and LLR values to the LDPC decoder for symbols being flipped are changed in an attempt to cause the LDPC decoder to converge. The term "symbol flipping" is used herein to refer to changing the values of symbols during a decoding operation in an attempt to cause the component codewords to converge on values which satisfy parity checks. The symbols may each include one or more bits. A symbol may be flipped by changing the log-likelihood ratio (LLR) input value to different element of the Galois Field associated with the LDPC decoder. For example, in a GF(4) decoder, the symbol may be flipped by adding 1, 2 or 3 to the hard decision. The symbol flipping may be performed in any manner suitable to the particular decoder and the format of its input. For example, the input to the LDPC decoder may consist of a hard decision identifying one of the Galois Field elements as the most likely real value along with an LLR value for each of the other Galois Field elements, indicating the likelihood that the real value corresponds to each of the other Galois Field elements. In this case, the symbol may be flipped by selecting another of the Galois Field elements as the hard decision. Examples of symbol flipping operations that may be applied in the symbol flipping LDPC decoding system are disclosed in U.S. patent application Ser. No. 13/274,443 filed Oct. 17, 2011 for a "LDPC Decoder With Targeted Symbol Flipping", and in U.S. patent application Ser. No. 13/363,751 filed Feb. 1, 2012 for a "Symbol Flipping Data Processor", which are incorporated herein for all purposes.

The symbol flipping LDPC decoding system may also include other error detection and correction techniques, such as a cyclic redundancy check (CRC) to identify mis-converged outputs from the LDPC decoder that satisfy parity checks but which are not correct. Such additional error detection techniques may be used to initiate or guide symbol flipping operations in the LDPC decoder to arrive at the correct results. An example of an external error detector to trigger symbol flipping that may be applied in the symbol flipping LDPC decoding system is disclosed in U.S. patent application Ser. No. 12/715,543 filed May 7, 2012 for a "Data Processing System with Failure Recovery", which is incorporated herein for all purposes.

The symbol flipping is targeted in some embodiments, meaning that the symbols to be flipped are selectively chosen from unsatisfied check pools, sets of check nodes for which parity check constraints are violated. The variable nodes connected to each check node for which parity check constraints are violated are members of the unsatisfied check pool. In some embodiments, parity check constraints are violated if any check node fails a parity check.

If the symbol flipping LDPC decoding system fails to converge during normal decoding operations, one or more selected symbols are flipped and decoding iterations are repeated in multiple modes of operation until the decoding converges or until all modes of targeted symbol flipping have been completed. As symbols are flipped, trying various possible values from the Galois Field for each flipped symbol, the LLR values corresponding to the flipped symbols are set in some embodiments to their full confidence value. Each mode performs exhaustive symbol flipping, trying each possible value of each symbol in an unsatisfied check pool until the data converges or the exhaustive trials are completed for the mode. If a mode completes without converging, the next mode of targeted symbol flipping is performed until all modes have been completed.

In some embodiments, three modes are provided. In a first mode, one symbol at a time in the unsatisfied check pool is flipped through each possible value in the Galois Field and decoding iterations repeated, exhaustively trying every possible value for every symbol in the unsatisfied check pool.

In a second mode, performed if the first mode fails to converge, two symbols at a time from the unsatisfied check pool are flipped through each possible combination of values in the Galois Field and decoding iterations are repeated.

In a third mode, performed if the second mode fails to converge, two symbols at a time from the unsatisfied check pool are flipped through each possible combination of values in the Galois Field, and parity checks are performed in the decoder without performing a decoding iteration to produce a new unsatisfied check pool. The operation of mode two is performed on the new unsatisfied check pool, flipping two symbols at a time from the new unsatisfied check pool through each possible combination of values in the Galois Field and repeating decoding iterations with the new values to determine whether the data will converge with the new values. If the targeted symbol flipping for the new unsatisfied check pool fails to converge, another two symbols from the original unsatisfied check pool are flipped to produce another new unsatisfied check pool and the process continues, exhaustively flipping symbols in all possible pairings from the original unsatisfied check pool to generate new unsatisfied check pools, then performing targeted symbol flipping in pairs exhaustively over the new unsatisfied check pools until the data converges or the exhaustive trials are completed. If the three modes fail to result in convergence, decoding may be halted or other error recovery techniques may be applied.

The symbol flipping decoding system disclosed herein is not limited to use with any particular type of LDPC decoder. The symbol flipping decoding system disclosed herein is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

Figure 2:
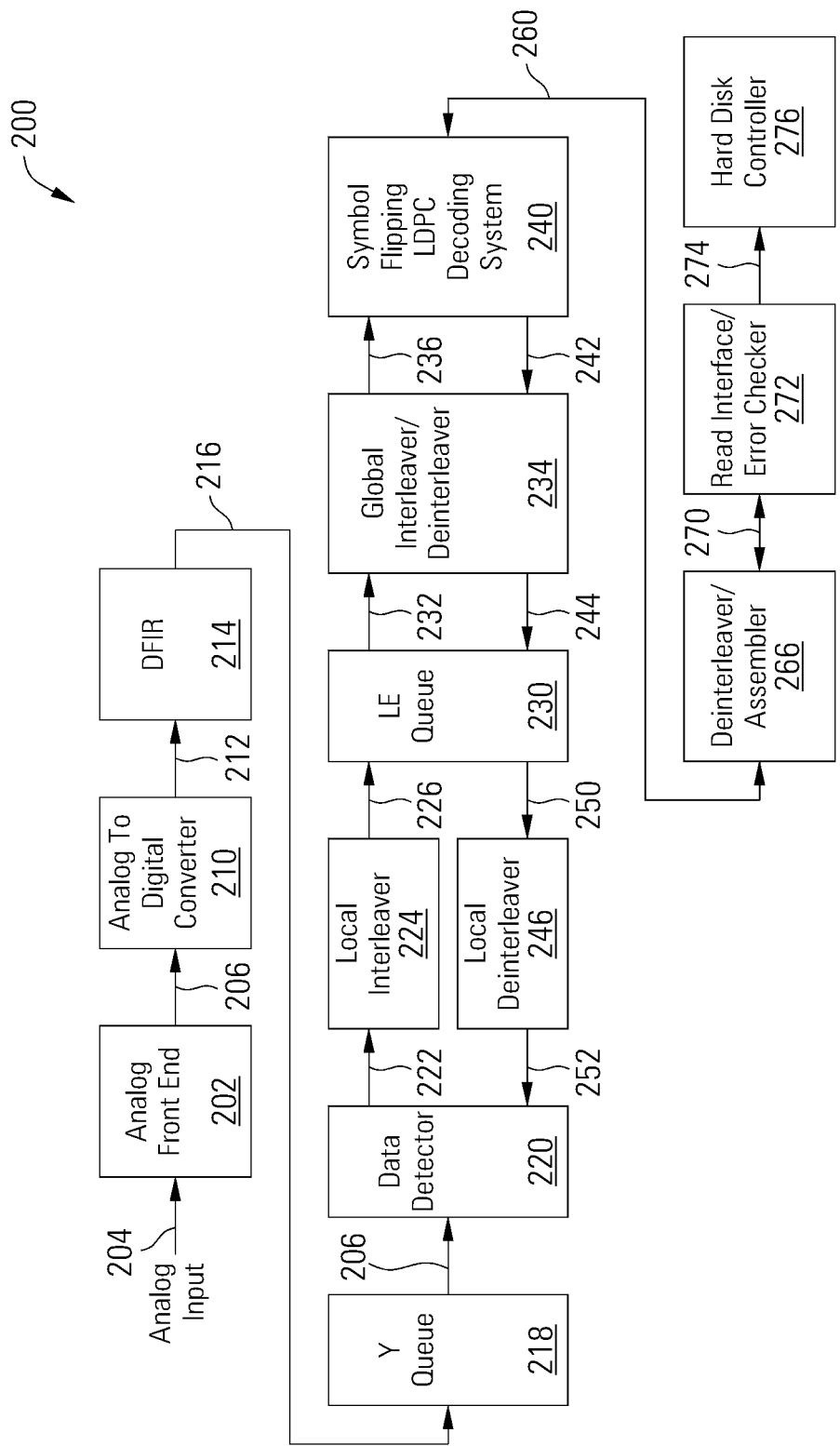
FIG. 2 depicts a block diagram of a read channel with a symbol flipping LDPC decoding system which may be used to retrieve or receive stored or transmitted data in accordance with various embodiments of the present inventions.

Turning to FIG. 2, a block diagram depicts a read channel 200 including a symbol flipping LDPC decoding system 240 which may be used to retrieve or receive stored or transmitted data in accordance with various embodiments of the present invention. A read channel 200 may be used, for example, to retrieve data recorded on a magnetic storage device such as a hard disk drive or received via a transmission medium. Read channel 200 includes an analog front end circuit 202 that receives an analog signal 204. Analog front end circuit 202 processes analog signal 204 and provides a processed analog signal 206 to an analog to digital converter circuit 210. Analog front end circuit 202 may include, but is not limited to, an analog filter and an amplifier circuit as are known in the art. Based upon the disclosure provided herein, one of ordinary skill in the art will recognize a variety of circuitry that may be included as part of analog front end circuit 202. In some cases, analog signal 204 is derived from a read/write head assembly that is disposed in relation to a storage medium. In other cases, analog signal 204 is derived from a receiver circuit that is operable to receive a signal from a transmission medium. The transmission medium may be wired or wireless. Based upon the disclosure provided herein, one of ordinary skill in the art will recognize a variety of sources from which analog input 204 may be derived.

Analog to digital converter circuit 210 converts processed analog signal 206 into a corresponding series of digital samples 212. Analog to digital converter circuit 210 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present inventions. Digital samples 212 are provided to an equalizer circuit 214. Equalizer circuit 214 applies an equalization algorithm to digital samples 212 to yield an equalized output 216 which is stored in a queue or memory 218. In some embodiments of the present inventions, equalizer circuit 214 is a digital finite impulse response (DFIR) filter circuit as are known in the art. In some cases, equalizer 214 includes sufficient memory to maintain one or more codewords until a data detector circuit 220 is available for processing. It may be possible that equalized output 216 may be received directly from a storage device in, for example, a solid state storage system. In such cases, analog front end circuit 202, analog to digital converter circuit 210 and equalizer circuit 214 may be eliminated where the data is received as a digital data input.

Data detector circuit 220 is operable to apply a data detection algorithm to a received codeword or data set, and in some cases data detector circuit 220 can process two or more codewords in parallel. In some embodiments of the present inventions, data detector circuit 220 is a Viterbi algorithm data detector circuit as is known in the art. In other embodiments of the present inventions, data detector circuit 220 is a maximum a posteriori data detector circuit as is known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present inventions. Data detector circuit 220 is started based upon availability of a data set from equalizer circuit 214 or from a central memory circuit 230.

Upon completion, data detector circuit 220 provides detector output 222. Detector output 222 includes soft data. As used herein, the phrase "soft data" is used in its broadest sense to mean reliability data with each instance of the reliability data indicating a likelihood that a corresponding bit position or group of bit positions has been correctly detected. In some embodiments of the present inventions, the soft data or reliability data is log likelihood ratio data as is known in the art. Detected output 222 is provided to a local interleaver circuit 224. Local interleaver circuit 224 is operable to shuffle sub-portions (i.e., local chunks) of the data set included as detected output 222 and provides an interleaved codeword 226 that is stored to central memory circuit 230. Interleaver circuit 224 may be any circuit known in the art that is capable of shuffling data sets to yield a re-arranged data set. Interleaved codeword 226 is stored to central memory circuit 230. The interleaved codeword 226 is accessed from central memory circuit 230 as a stored codeword 232 and globally interleaved by a global interleaver/de-interleaver circuit 234. Global interleaver/deinterleaver circuit 234 may be any circuit known in the art that is capable of globally rearranging codewords. Global interleaver/deinterleaver circuit 234 provides a decoder input 236 into a symbol flipping LDPC decoding system 240. Based upon the disclosure provided herein, one of ordinary skill in the art will recognize other decode algorithms that may be used in relation to different embodiments of the present inventions. The symbol flipping LDPC decoding system 240 applies a data decode algorithm to decoder input 236 in a variable number of local iterations. The symbol flipping LDPC decoding system 240 may also be operable to perform additional error correction functions such as bit or symbol flipping.

Where the symbol flipping LDPC decoding system 240 fails to converge (i.e., fails to yield the originally written data set) and a number of local iterations through an LDPC decoder in symbol flipping LDPC decoding system 240 exceeds a threshold, the resulting decoded output is provided as a decoded output 242 back to central memory circuit 230 where it is stored awaiting another global iteration through data detector circuit 220 and symbol flipping LDPC decoding system 240. Multiple sectors may be processed simultaneously in the read channel 200, with additional sectors being admitted to the data detector 220 as other sectors converge in the symbol flipping LDPC decoding system 240 and are output and cleared from the queue 218 and central memory circuit 230.

Prior to storage of decoded output 242 to central memory circuit 230, decoded output 242 is globally deinterleaved to yield a globally deinterleaved output 244 that is stored to central memory circuit 230. The global deinterleaving reverses the global interleaving earlier applied to stored codeword 232 to yield decoder input 236. Once data detector circuit 220 is available, a previously stored deinterleaved output 244 is accessed from central memory circuit 230 and locally deinterleaved by a deinterleaver circuit 246. Deinterleaver circuit 246 rearranges decoder output 250 to reverse the shuffling originally performed by interleaver circuit 224. A resulting deinterleaved output 252 is provided to data detector circuit 220 where it is used to guide subsequent detection of a corresponding data set received as equalized output 216.

Alternatively, where the decoded output converges (i.e., yields the originally written data set) in the symbol flipping LDPC decoding system 240, the resulting decoded output is provided as an output codeword 260 to a deinterleaver/assembler circuit 266. Deinterleaver/assembler circuit 266 rearranges the data to reverse both the global and local interleaving applied to the data to yield a deinterleaved output 270. Deinterleaver/assembler circuit 266 may also be operable to assemble trial versions of sectors from decoded component codewords in output 260 where multiple versions of component codewords or data sectors are available, for example as generated by symbol flipping trials in symbol flipping LDPC decoding system 240. Deinterleaved hard decision output 270 is provided to a read interface/error checker 272, which performs additional error checking such as CRC checks on the deinterleaved output 270. The read interface/error checker 272 may report the results of the error checking to the symbol flipping LDPC decoding system 240 to guide subsequent decoding operations. If the deinterleaved output 270 passes the error checking in read interface/error checker 272, the data 274 may be forwarded to a hard disk controller 276 or other destination, either automatically after passing or as instructed by the symbol flipping LDPC decoding system 240.

Figure 3:
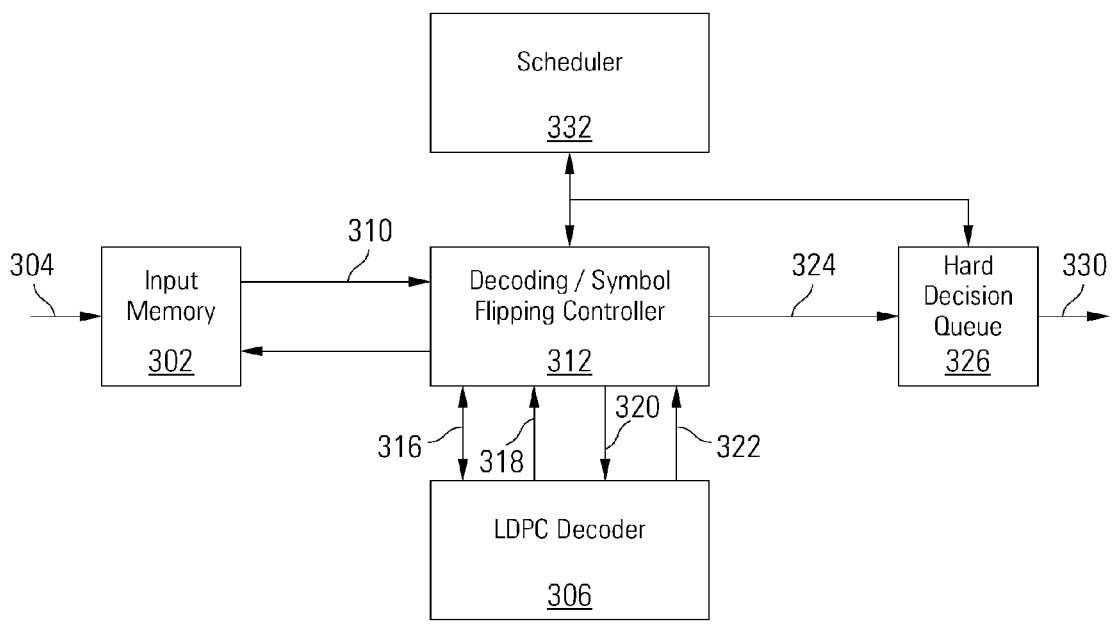
FIG. 3 depicts a block diagram of a symbol flipping LDPC decoding system in accordance with various embodiments of the present inventions.

Turning to FIG. 3, a symbol flipping LDPC decoding system 300 is depicted which may be used in the read channel 200 of FIG. 2 in accordance with various embodiments of the present invention. An input memory 302 stores a soft data decoder input 304, or LLR data of unconverged component codewords to be decoded in a symbol flipping LDPC decoder 306. The unconverged LLR data 310 from the input memory 302 are provided to a decoding/symbol flipping controller 312 which stores component codewords in a ping pong memory as they are decoded by symbol flipping LDPC decoder 306 and in which symbols are flipped during symbol flipping operations. In some stages of operation, such as during symbol flipping operations, the decoding/symbol flipping controller 312 sends requests 314 for unconverged LLR data 310 from the input memory 302. Modified LLR data and hard decision (HD) data 316 is transferred between the decoding/symbol flipping controller 312 and the symbol flipping LDPC decoder 306 during decoding operations, with the LLR values updated during local decoding iterations in the symbol flipping LDPC decoder 306. The symbol flipping LDPC decoder 306 performs variable node and check node updates to calculate the new values for the modified LLR data 316. The symbol flipping LDPC decoder 306 also performs parity checks on the modified LLR data 316, determining which parity checks are not satisfied and yielding a pool or list of unsatisfied checks (USC). The symbol flipping LDPC decoder 306 transmits USC flags 318 to the decoding/symbol flipping controller 312, identifying the number and location of unsatisfied parity checks.

In some embodiments, the USC indexes in the symbol flipping LDPC decoder 306 are translated to memory addresses in the decoding/symbol flipping controller 312 for symbols to be flipped by passing symbol indexes 320 and symbol addresses 322 between the decoding/symbol flipping controller 312 and the symbol flipping LDPC decoder 306. During a symbol flipping operation, a USC index 320 is provided by the decoding/symbol flipping controller 312 to the symbol flipping LDPC decoder 306, identifying the index of one or more symbols to be flipped from the USC pool. The symbol flipping LDPC decoder 306 returns the symbol address 322 of the symbols to be flipped to the decoding/symbol flipping controller 312, so that the values can be flipped or changed in the decoding/symbol flipping controller 312 based on the USC pool identified by the symbol flipping LDPC decoder 306.

Hard decisions 324 for the component codewords generated by the symbol flipping LDPC decoder 306 in decoding operations and symbol flipping operations are transferred from the decoding/symbol flipping controller 312 to a hard decision queue 326. In some embodiments, the hard decision queue 326 stores multiple versions of component codeword hard decision data generated by the symbol flipping LDPC decoder 306, which can be assembled to form multiple possible output sectors 330 to be tested in an external error detector such as a CRC circuit in a read interface/error checker (e.g., 272). In such instances, the external error detector reports back to the symbol flipping LDPC decoding system 300 which of the possible output sectors is correct, enabling the symbol flipping LDPC decoding system 300 to select and output the correct version of a data sector made up of the hard decisions for multiple component codewords in the sector.

A scheduler 332 controls decoding operations and symbol flipping operations in the symbol flipping LDPC decoding system 300, initiating symbol flipping operations when data fails to converge or when an external error detector indicates that the data has misconverged. The scheduler 332 controls local decoding iterations in the symbol flipping LDPC decoder 306, selecting data to be transferred between the decoding/symbol flipping controller 312 and the symbol flipping LDPC decoder 306, and controlling a decoding and symbol flipping mode in the symbol flipping LDPC decoding system 300.

In some embodiments, the symbol flipping LDPC decoding system 300 operates in three stages, a normal read stage, a symbol flipping capture stage, and a symbol flipping calculate stage. During the normal read stage, after each local decoding iteration the symbol flipping LDPC decoder 306 generates an unsatisfied parity check value and indicates to the scheduler 332 if the number of unsatisfied checks is greater than a threshold value, or provides the number of unsatisfied parity checks to the scheduler 332, enabling the scheduler 332 to compare it with the threshold value. For each component codeword, the scheduler 332 determines whether symbol flipping is warranted, that is, whether the number of unsatisfied checks is greater than the threshold value, and whether symbol flipping is feasible. For example, in some embodiments the number of component codewords in a codeword or data sector that is allowed to undergo symbol flipping is limited to a number less than the total number of component codewords in the data sector. In some embodiments, the symbol flipping LDPC decoding system 300 transfers component codeword hard decisions to the external host such as the hard disk controller 276 along with an indication of whether symbol flipping is warranted and feasible, and the hard disk controller 276 commands the scheduler 332 to initiate the symbol flipping operation. In other embodiments, the scheduler 332 automatically initiates symbol flipping operations in the symbol flipping LDPC decoding system 300 when warranted and feasible.

After a symbol flipping operation is initiated, either by the scheduler 332 automatically or when approved or requested by the hard disk controller 276 or other external controller, the scheduler 332 sets the symbol flipping capture stage and starts the decoding operation in the symbol flipping LDPC decoding system 300 to determine which symbols will be flipped in the subsequent symbol flipping calculation stage. The component codewords are processed in the symbol flipping LDPC decoder 306, generating the modified LLR values and hard decisions 316, and the USC flags 316 identifying the number and location of unsatisfied parity checks. The number and location of unsatisfied parity checks, for example the indexes of symbols for which symbols in the component codewords which failed to converge, are stored in the decoding/symbol flipping controller 312. After the maximum number of global and local decoding iterations are completed in the symbol flipping LDPC decoding system 300 and in the overall system (e.g., in a read channel 200), the converged component codewords are transferred to the hard decision queue 326 from the decoding/symbol flipping controller 312, and the unconverged component codewords form the initial list of symbols to be flipped in a subsequent symbol flipping calculation stage. At the end of this mode of operation, the input memory 302 contains the unconverged initial component codeword LLR values, the decoding/symbol flipping controller 312 contains the USC list and count of unsatisfied parity checks, and the hard decision queue 326 contains the converged component codeword hard decisions.

In the symbol flipping calculation stage, the scheduler 332 causes the decoding/symbol flipping controller 312 to flip symbol values while decoding. The decoding/symbol flipping controller 312 requests component codeword LLR values 310 from the input memory 302 for those symbols in the USC pool generated during the symbol flipping capture stage, flipping selected symbols as it receives the data according to the symbol flipping stage in operation. For example, either one or two symbols may be flipped at a time according to the three symbol flipping modes disclosed above. The symbol flipping LDPC decoder 306 decodes the modified component codewords with the flipped symbols, and if a component codeword converges in the symbol flipping LDPC decoder 306 with the flipped symbols it is transferred to the hard decision queue 326. Possible output sectors 330 are formed from the converged component codeword hard decision data generated by the symbol flipping LDPC decoder 306 and are tested in an external error detector such as a CRC circuit in a read interface/error checker (e.g., 272). This process is repeated until a data sector has converged in the symbol flipping LDPC decoder 306 and has passed the external error detection, or until a decoding limit is reached.

Figure 4:
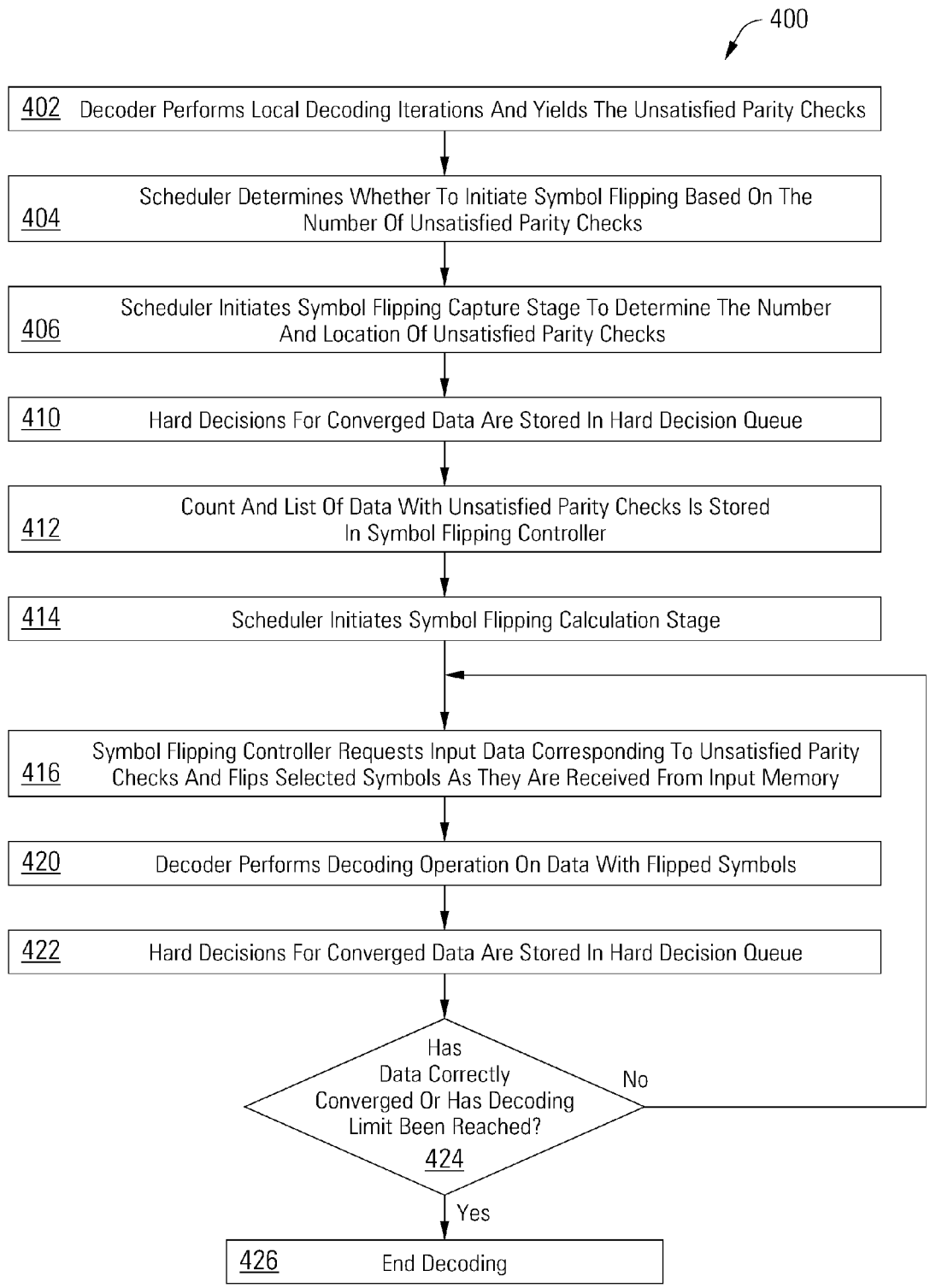
FIG. 4 depicts a method for data decoding with symbol flipping in an LDPC decoding system in accordance with various embodiments of the present inventions.

Turning to FIG. 4, a flow diagram 400 depicts a method for data decoding with symbol flipping in a symbol flipping LDPC decoding system 300 such as that of FIG. 3. Following flow diagram 400, the decoder performs local decoding iterations and yields the unsatisfied parity checks. (Block 402) For example, an LDPC decoder may indicate the number of unsatisfied parity checks to the scheduler. The scheduler determines whether to initiate symbol flipping based on the number of unsatisfied parity checks. (Block 404) If the number of unsatisfied parity checks exceeds a threshold, a symbol flipping operation is initiated, beginning with a symbol flipping capture stage. The scheduler initiates the symbol flipping capture stage to determine the number and location of unsatisfied parity checks. (Block 406) Hard decisions for data that converges in the decoder are stored in a hard decision queue. (Block 410) For example, if a component codeword converges on values that satisfy parity checks, the hard decisions for the component codeword generated by the decoder are stored in the hard decision queue. For data that results in unsatisfied parity checks, the count and list of unsatisfied checks is stored in a symbol flipping controller. (Block 412) The scheduler initiates a symbol flipping calculation stage in which the symbols with unsatisfied checks are flipped during a decoding operation. (Block 414) The symbol flipping controller requests input data corresponding to unsatisfied parity checks and flips selected symbols as they are received from input memory. (Block 416) For example, component codewords that fail to converge in the decoder or which have a number of unsatisfied parity checks greater than a threshold are again decoded in the LDPC decoder as selected symbols are flipped. The decoder performs a decoding operation on the data with flipped symbols. (Block 420) If data converges in the decoder, the hard decisions for the data are stored in hard decision queue. (Block 422) If the data correctly converges or if a decoding limit has been reached (bock 424), decoding is finished. (Block 426) If data has not converged with flipped symbols and if the decoding limit such as the maximum number of local or global iterations has not been reached, the symbol flipping operation may be continued (block 416), for example moving to another of the three symbol flipping modes disclosed above.

Figure 5:
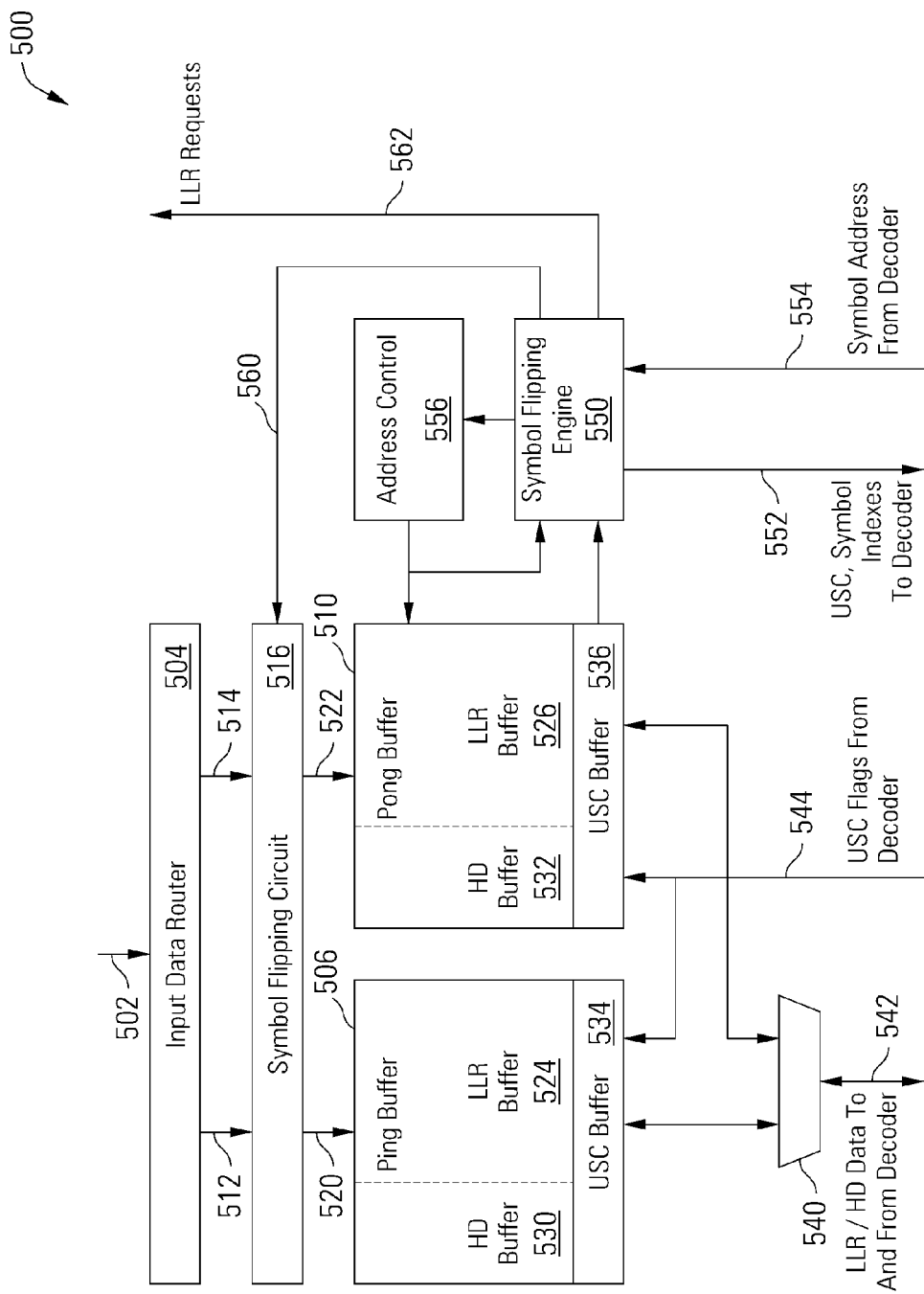
FIG. 5 depicts a block diagram of a decoding/symbol flipping controller that may be used in a symbol flipping LDPC decoding system in accordance with various embodiments of the present inventions.

Turning to FIG. 5, a decoding/symbol flipping controller 500 is depicted that may be used in place of the decoding/symbol flipping controller 312 of FIG. 3 in accordance with various embodiments of the present inventions. Soft data to be decoded is received at decoder input 502 and passes through an input data router 504. Data is decoded in decoding/symbol flipping controller 500 in ping-pong fashion, decoding LLR data for unconverged component codewords one by one first from one buffer 506 (or "ping" buffer) and then from another buffer 510 (or "pong" buffer). The input data router 504 routes the unconverged component codewords from decoder input 502 either into a first path 512 to be stored in the ping buffer 506 or into a second path 514 to be stored in the pong buffer 510.

A symbol flipping circuit 516 flips selected symbols in the LLR data as it is received at first path 512 or second path 514, yielding LLR data with flipped symbols 520 or 522 to be stored in ping buffer 506 or pong buffer 510.

The ping buffer 506 and pong buffer 510 each contain an LLR buffer 524 and 526 to contain input unconverged LLR values with flipped symbols, a hard decision buffer 530 and 532 to contain hard decisions yielded by the decoder, and an unsatisfied check pool buffer 534 and 536 to contain lists of unsatisfied parity checks from the decoder. A switch or multiplexer 540 directs unconverged LLR values with flipped symbols from either the ping buffer 506 or pong buffer 510 to the decoder via a decoder input/output (I/O) 542 and hard decisions from the decoder via the decoder I/O 542 to either the ping buffer 506 or pong buffer 510, depending on which is currently being processed. The USC list and count of unsatisfied parity checks are received at a USC flag input 544 from the decoder and stored in the buffer 506 or 510 that contains the corresponding LLR data.

A symbol flipping engine 550 retrieves USC and symbol indexes from the ping buffer 506 or pong buffer 510 currently being processed and transmits them to the decoder at a USC and symbol index output 552. The USC index identifies the symbol to be flipped from the USC pool, and the symbol index identifies the Galois Field element to which the symbol value should be changed. The decoder returns a symbol address 554 to the symbol flipping engine 550 identifying the address in the ping buffer 506 or pong buffer 510 of the symbol to be flipped. The symbol flipping engine 550 provides symbol addresses to an address control circuit 556 to control the storage of LLR data in the ping buffer 506 and pong buffer 510. The symbol flipping engine 550 also provides a symbol flipping control signal 560 to the symbol flipping circuit 516 to control the changing of values as data is received, and an LLR request signal 562 to an input memory (e.g., 302) to request LLR data for unconverged component codewords to be reprocessed with symbol flipping.

Symbol flipping may be performed during data transfers from an input memory (e.g., 302) to a decoder (e.g., 306) as disclosed above to simplify timing and minimize logic required. In other embodiments, LLR data may be stored in the decoding/symbol flipping controller 312 or the symbol flipping LDPC decoder 306 before flipping symbol values.

Figure 6:
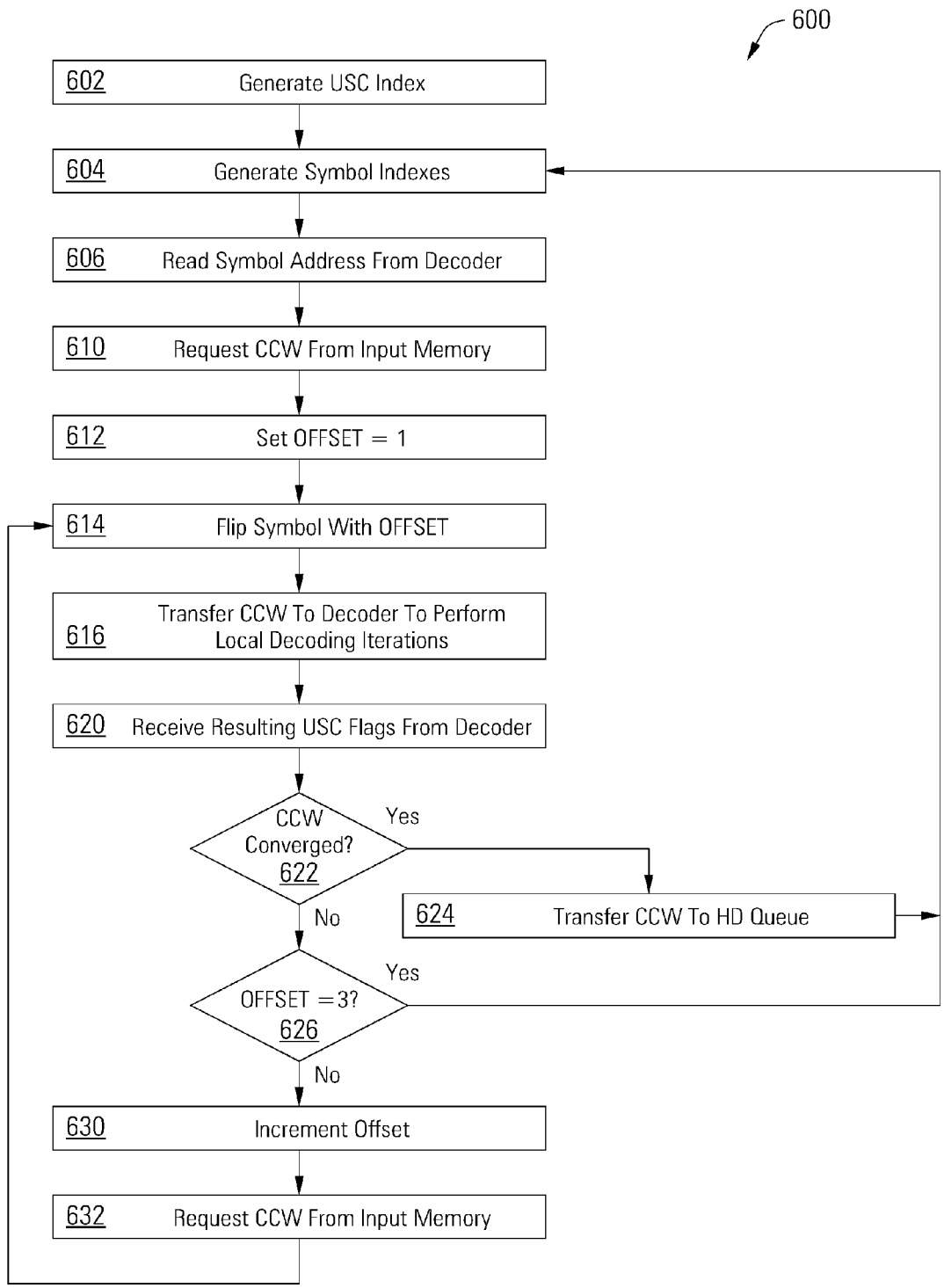
FIG. 6 depicts a method for controlling symbol flipping in a decoding/symbol flipping controller in accordance with various embodiments of the present inventions.

Turning to FIG. 6, a flow diagram 600 of a method for controlling symbol flipping in a decoding/symbol flipping controller (e.g., 500) is depicted in accordance with various embodiments of the present inventions. Following flow diagram 600, the unsatisfied check index is generated. (Block 602) The unsatisfied check index identifies the parity checks that were not satisfied during a symbol flipping capture stage. Symbol indexes are generated, identifying the symbols associated with the failed parity checks. (Block 604) Symbol addresses corresponding with the symbol indexes are read from the decoder. (Block 606) The symbol flipping controller requests a component codeword containing the symbols in the unsatisfied check pool from an input memory. (Block 610) An OFFSET variable is initialized to a value of 1. (Block 612) The OFFSET variable is used to offset the Galois Field element of a symbol to be flipped. For example, if the symbol initially has the value of element 3 of the Galois Field, an offset of 1 would set the symbol to the value of element 4 of the Galois Field. The Galois Field element number is combined with the OFFSET variable in modulo fashion, wrapping around when it reaches the maximum element number. For example, with a GF(4) decoder having 4 elements in the Galois Field, an OFFSET of 3 added to an initial value of element 3 would result in element 2. The symbol being flipped is thus changed using the OFFSET variable. (Block 614) The CCW with one or more flipped symbols is transferred to the decoder to perform local decoding iterations. (Block 616) The number of local decoding iterations to be performed in the decoder may be limited to a predetermined maximum number, stopping when the data converges or when the maximum number of iterations has been reached. The symbol flipping controller receives the resulting unsatisfied check flags from the decoder. (Block 620) A determination is made as to whether the CCW converged in the decoder. (Block 622) This determination may be made, for example, based on the number of parity checks that are not satisfied. If the CCW converged, the CCW hard decisions are transferred to a hard decision queue. (Block 624) Otherwise, the symbol flipping is continued. If the OFFSET has reached the maximum value, for example 3 for a GF(4) decoder, another symbol is flipped, continuing the process at block 604. Otherwise, the OFFSET is incremented. (Block 630) Another CCW containing the symbol to be flipped is requested from the input memory. (Block 632) The value of the symbol is flipped as the symbol is received by the symbol flipping controller (block 614), and the process continues.

Figure 7:
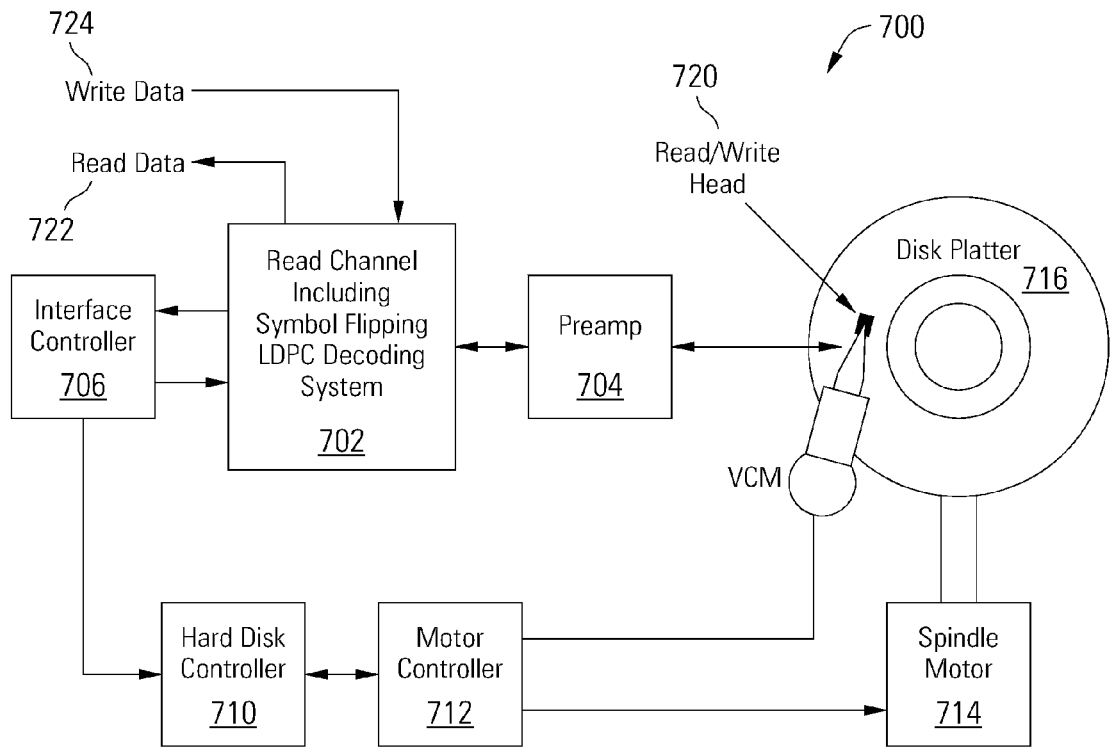
FIG. 7 depicts a storage system including a symbol flipping LDPC decoding system in accordance with various embodiments of the present invention.
Figure 8:
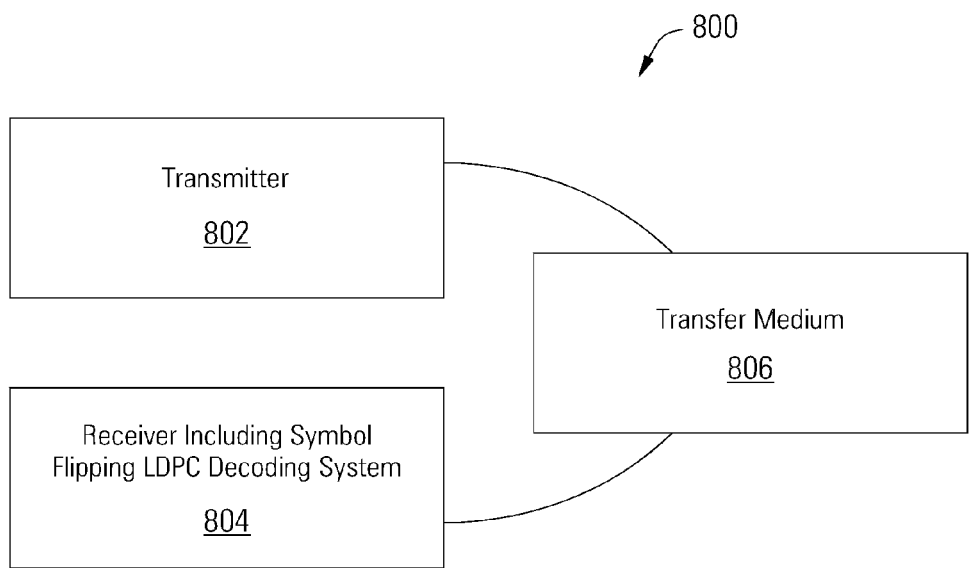
FIG. 8 depicts a wireless communication system including a symbol flipping LDPC decoding system in accordance with various embodiments of the present invention.

Although the symbol flipping LDPC decoding system disclosed herein is not limited to any particular application, several examples of applications are illustrated in FIGS. 7 and 8 that benefit from embodiments of the present invention. Turning to FIG. 7, a storage system 700 is illustrated as an example application of a symbol flipping LDPC decoding system in accordance with some embodiments of the present inventions. The storage system 700 includes a read channel circuit 702 with a symbol flipping LDPC decoding system in accordance with some embodiments of the present invention. Storage system 700 may be, for example, a hard disk drive. Storage system 700 also includes a preamplifier 704, an interface controller 706, a hard disk controller 710, a motor controller 712, a spindle motor 714, a disk platter 716, and a read/write head assembly 720. Interface controller 706 controls addressing and timing of data to/from disk platter 716. The data on disk platter 716 consists of groups of magnetic signals that may be detected by read/write head assembly 720 when the assembly is properly positioned over disk platter 716. In one embodiment, disk platter 716 includes magnetic signals recorded in accordance with either a longitudinal or a perpendicular recording scheme.

In a typical read operation, read/write head assembly 720 is accurately positioned by motor controller 712 over a desired data track on disk platter 716. Motor controller 712 both positions read/write head assembly 720 in relation to disk platter 716 and drives spindle motor 714 by moving read/ write head assembly 720 to the proper data track on disk platter 716 under the direction of hard disk controller 710. Spindle motor 714 spins disk platter 716 at a determined spin rate (RPMs). Once read/write head assembly 720 is positioned adjacent the proper data track, magnetic signals representing data on disk platter 716 are sensed by read/write head assembly 720 as disk platter 716 is rotated by spindle motor 714. The sensed magnetic signals are provided as a continuous, minute analog signal representative of the magnetic data on disk platter 716. This minute analog signal is transferred from read/write head assembly 720 to read channel circuit 702 via preamplifier 704. Preamplifier 704 is operable to amplify the minute analog signals accessed from disk platter 716. In turn, read channel circuit 702 decodes and digitizes the received analog signal to recreate the information originally written to disk platter 716. This data is provided as read data 722 to a receiving circuit. As part of decoding the received information, read channel circuit 702 processes the received signal using a symbol flipping LDPC decoding system. Such a symbol flipping LDPC decoding system may be implemented consistent with that disclosed above in relation to FIGS. 3-6. A write operation is substantially the opposite of the preceding read operation with write data 724 being provided to read channel circuit 702. This data is then encoded and written to disk platter 716.

It should be noted that storage system 700 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such storage system 700, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

Turning to FIG. 8, a wireless communication system 800 or data transmission device including a receiver 804 with a symbol flipping LDPC decoding system is shown in accordance with some embodiments of the present inventions. Communication system 800 includes a transmitter 802 that is operable to transmit encoded information via a transfer medium 806 as is known in the art. The encoded data is received from transfer medium 806 by receiver 804. Receiver 804 incorporates a symbol flipping LDPC decoding system. Such a symbol flipping LDPC decoding system may be implemented consistent with that disclosed above in relation to FIGS. 3-6.

It should be noted that the various blocks discussed in the above application may be implemented in integrated circuits along with other functionality. Such integrated circuits may include all of the functions of a given block, system or circuit, or a portion of the functions of the block, system or circuit. Further, elements of the blocks, systems or circuits may be implemented across multiple integrated circuits. Such integrated circuits may be any type of integrated circuit known in the art including, but not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the present invention provides novel apparatuses, systems, and methods for a symbol flipping LDPC decoding system. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. An apparatus for decoding data comprising:
   a low density parity check decoder operable to decode codewords and to identify unsatisfied parity checks;
   a symbol flipping controller operable to change values of at least one symbol in the codewords based on the unsatisfied parity checks to assist the low density parity check decoder to decode the codewords;
   a scheduler operable to control a decoding and symbol flipping mode in the low density parity check decoder and the symbol flipping controller; and
   a hard decision queue operable to store hard decisions for converged codewords from the low density parity check decoder.

2. The apparatus of claim 1, further comprising an input memory, wherein the symbol flipping controller is operable to change the values of the at least one symbol in the codewords as it is received from the input memory.

3. The apparatus of claim 2, wherein the symbol flipping controller is operable to request the codewords from the input memory.

4. The apparatus of claim 1, wherein the symbol flipping controller comprises a ping pong buffer operable to store at least two of the codewords to be decoded one by one.

5. The apparatus of claim 4, wherein the symbol flipping controller comprises an input data router operable to route the codewords to buffers in the ping pong buffer as they are received at an input to the symbol flipping controller.

6. The apparatus of claim 1, wherein the symbol flipping controller comprises a symbol flipping engine operable to provide unsatisfied check indexes to the low density parity check decoder and to receive symbol addresses from the low density parity check decoder.

7. The apparatus of claim 6, wherein the symbol flipping controller comprises a symbol flipping circuit operable to change the values of the at least one symbol as directed by the symbol flipping engine.

8. The apparatus of claim 1, wherein the symbol flipping controller comprises a first symbol flipping mode in which one symbol at a time in an unsatisfied check pool is flipped through each possible value in a Galois Field while decoding iterations are performed, a second symbol flipping mode in which two symbols at a time from the unsatisfied check pool are flipped through each possible combination of values in the Galois Field while decoding iterations are performed, and a third symbol flipping mode in which two symbols at a time from the unsatisfied check pool are flipped through each possible combination of values in the Galois Field while decoding iterations are performed to yield at least one new unsatisfied check pool to be used in symbol flipping operations.

9. The apparatus of claim 1, wherein the symbol flipping controller is operable to implement a symbol flipping capture stage of operation to identify at least one symbol associated with the unsatisfied parity checks and a symbol flipping calculation stage of operation to flip a value of the at least one symbol.

10. The apparatus of claim 1, further comprising an error checker operable to check the converged codewords for errors.

11. The apparatus of claim 10, wherein the error checker comprises a cyclic redundancy check.

12. The apparatus of claim 10, further comprising an assembler circuit operable to assemble trial versions of data sectors from the hard decisions for the converged codewords in the hard decision queue for checking by the error checker.

13. The apparatus of claim 1, wherein the low density parity check decoder, the symbol flipping controller, the scheduler and the hard decision queue are implemented as an integrated circuit.

14. The apparatus of claim 1, wherein the low density parity check decoder, the symbol flipping controller, the scheduler and the hard decision queue are incorporated in a storage device.

15. The apparatus of claim 1, wherein the low density parity check decoder, the symbol flipping controller, the scheduler and the hard decision queue are incorporated in a storage system comprising a redundant array of independent disks.

16. The apparatus of claim 1, wherein the low density parity check decoder, the symbol flipping controller, the scheduler and the hard decision queue are incorporated in a transmission system.

17. A method for data decoding with symbol flipping, comprising:

generating a list of unsatisfied parity checks for a component codeword using a low density parity check decoder;
flipping a value of at least one symbol associated with the unsatisfied parity checks in the component codeword using a symbol flipping controller;
decoding the component codeword with the at least one symbol having a flipped value using the low density parity check decoder; and
storing hard decisions for the component codeword in a hard decision queue when the component codeword has converged in the low density parity check decoder.

18. The method of claim 17, further comprising the symbol flipping controller requesting the component codeword from a memory and flipping the value of the at least one symbol as the component codeword is received from the memory.

19. The method of claim 17, further comprising forming a plurality of trial sectors from the hard decisions in the hard decision queue and testing the trial sectors for errors.

20. A storage system comprising:
a storage medium maintaining a data set;
a read/write head assembly operable to sense the data set on the storage medium and to provide an analog output corresponding to the data set;
an analog to digital converter operable to sample a continuous signal to yield a digital output; and
a symbol flipping low density parity check decoding system operable to decode codewords in the digital output, comprising:
a low density parity check decoder operable to decode the codewords and to identify unsatisfied parity checks;
a symbol flipping controller operable to change values of at least one symbol in the codewords based on the unsatisfied parity checks to assist the low density parity check decoder to decode the codewords;
a scheduler operable to control a decoding and symbol flipping mode in the low density parity check decoder and the symbol flipping controller; and
a hard decision queue operable to store hard decisions for converged codewords from the low density parity check decoder.

* * * * *